United States Patent [19]

Gerston et al.

[11] Patent Number: 4,783,636

[45] Date of Patent: Nov. 8, 1988

[54] AMPLIFIERS PROVIDING BALANCED OUTPUT SIGNALS

[75] Inventors: Charles Gerston; Edmund C. Golbeck, both of Scottsdale, Ariz.

[73] Assignee: Motorola, Inc., Schaumburg, Ill.

[21] Appl. No.: 103,880

[22] Filed: Oct. 2, 1987

[51] Int. Cl.[4] .......................... H03F 3/45; H03F 3/04
[52] U.S. Cl. .................................... 330/252; 330/297
[58] Field of Search ............... 330/252, 259, 260, 261, 330/297

[56] References Cited

U.S. PATENT DOCUMENTS 4,571,554  2/1986  Martin et al. ..................... 330/297

Primary Examiner—Gene Wan

Attorney, Agent, or Firm—Maurice J. Jones

[57] ABSTRACT

Amplifier circuitry includes a differential pair of transistors having commonly connected electrodes driven by a normally constant current supply transistor. Portions of the output signals developed by the differential transistors tend to vary with variations in the magnitude of a first power supply potential. A control circuit causes the magnitude of the normally constant current source to vary so that the other excursions of the output signal are substantially equal in magnitude to the first power supply potential to provide balanced signals across the load. A feedback circuit stabilizes the magnitude of the normally constant current supply transistors against variations in the magnitude of another power supply potential or in the constant current supply.

11 Claims, 1 Drawing Sheet

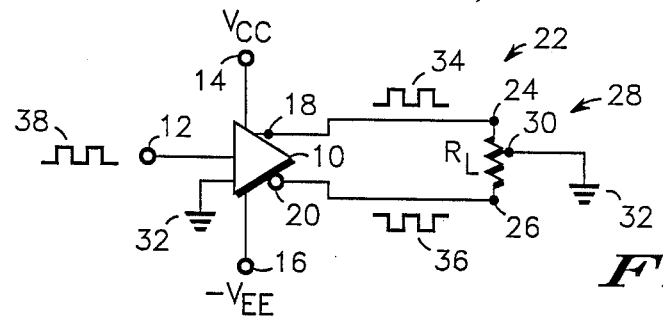
FIG. 1
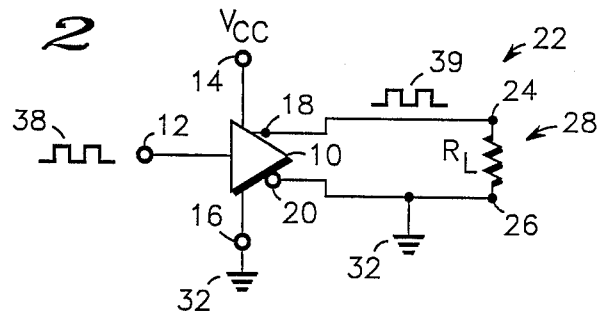
FIG. 2
FIG. 3
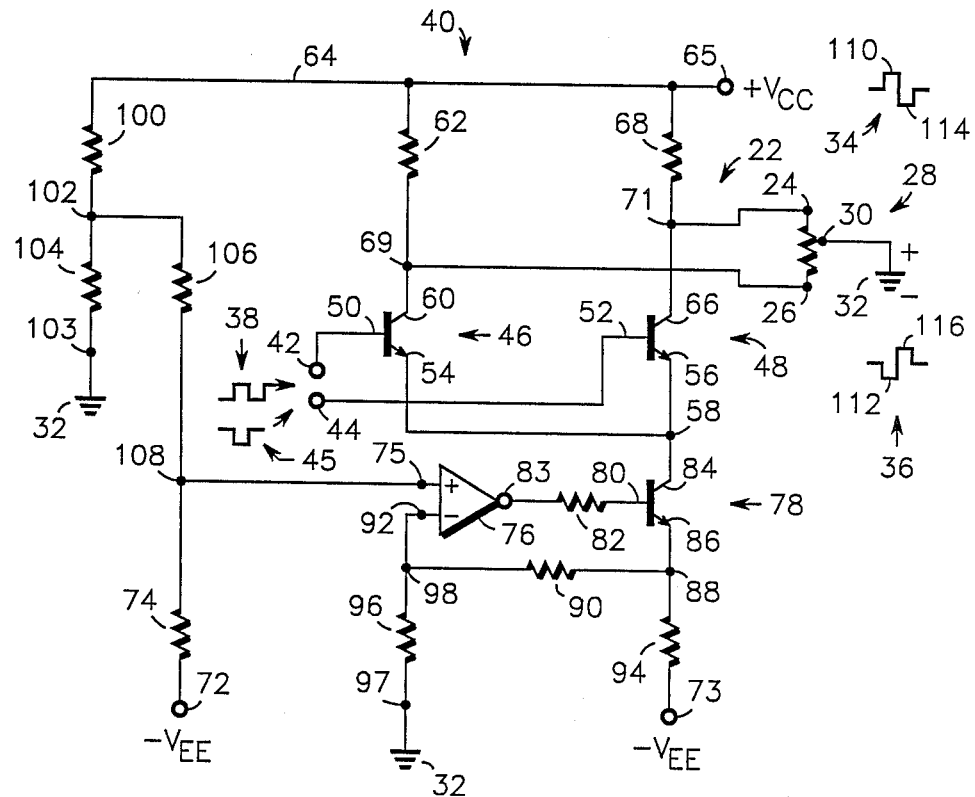

AMPLIFIERS PROVIDING BALANCED OUTPUT SIGNALS

The present invention relates to amplifier circuitry which meets a plurality of requirements such as those dictated by military applications. More specifically, the present invention relates to amplifier circuitry which automatically regulates the symmetry or balance of the output signals thereof.

Line driver circuits of different configurations are used to provide output signals through balanced transmission lines. The configuration of a line driver usually depends on whether the load is single ended (unbalanced) or differential (balanced). This is because one of the output terminals of a line driver circuit is grounded when driving a single ended load. The active pullup devices utilized in some prior art line drivers designed for driving differential loads could be destroyed or impaired to the extent that military specifications such as MIL-STD-188-114 would not be met as a result of the excessive power dissipation caused when large currents are drawn through these devices as a result of such grounding. Furthermore, it is possible that either of the output terminals of the line driver might be accidentally shorted to ground during operation. Hence, there is a need for a single circuit configuration capable of driving either balanced or unbalanced loads and which can withstand the grounding of either or both of the output terminals thereof and still meet military specifications, for example.

Moreover, electronic equipment using line drivers which is utilized in military or other application may be subjected to adverse temperature and other environmental conditions. These conditions can result in undesirable variations in the magnitudes of the power supply potentials applied to the line driver circuits and also in changes in the operating characteristics of the devices included within such circuits. As a result, some prior art line drivers cannot maintain the desired symmetry in the magnitudes of the output signals thereof necessary for driving balanced loads. Additionally, it is desirable for line drivers to be capable of operating with different power supplies providing a plurality of voltages having different magnitudes.

Also, it is usually desired that line driver circuitry provide an output impedance at the output terminals thereof which is substantially equal to the characteristic impedance of a transmission line having one end connected thereto to absorb reflected power from the load connected to the other end of the transmission line. Thus, it is desirable for the output impedance of the line driver to be easily changeable so that substantially the same configuration can be used with transmission lines having a variety of characteristic impedances.

Some prior art line driver circuits which solve some of the above-mentioned problems are too expensive or complicated for many applications. For example, such prior art circuitry may not be suitable for use in high quantity production items or for a variety of different applications.

SUMMARY OF THE INVENTION

Accordingly, it is an object of one aspect of the invention to provide amplifier circuitry which will continue to operate in a satisfactory manner even though one of the output terminal thereof is grounded during operation.

Still another object of an additional aspect of the invention is to provide amplifier circuitry which maintains balance in the magnitudes of the positive and negative going output signal excursions even though the magnitudes of the power supply potentials thereof vary.

Another object of a further aspect of the invention is to provide amplifier circuitry which is usable with a variety of different power supply potentials.

A further object of another aspect of the invention is to provide amplifier circuitry which compensates for undesired changes induced therein by temperature and other environmental conditions to maintain balance in the magnitudes of the output signals thereof.

An additional object of another aspect of the invention is to provide amplifier circuitry having a readily changeable output impedance.

Still another object of a further aspect of the invention is to provide simple and inexpensive amplifier circuitry suitable for use in high quantity production.

A particular embodiment of an amplifier circuit in accordance with the invention provides an output signal across an electrical load having first portions of a first polarity with magnitudes which tend to vary in response to a first power supply potential that has a varying magnitude. The amplifier circuit includes a differentially connected pair of transistors adapted to receive the first power supply potential and to provide the first output signal portions. A current supply transistor responds to a drive signal to control the magnitudes of second output signal portions of a second polarity. An operational amplifier circuit having non-inverting input and output terminals is coupled to the current supply transistor. A control circuit is coupled to the non-inverting input terminal of the operational amplifier circuit and applies first control signals which vary in response to the variations in the first power supply potential thereto. The operational amplifier circuit is responsive to these first control signals to increase the drive to the current supply transistor in response to increases in the magnitude of the first power supply potential and to decrease the drive to the current supply transistor in response to decreases in the magnitude of the first power supply potential so that the magnitude of the second output signal portions change in response to the variations in magnitude of the first power supply potential along with the first output signal portions so that a composite, balanced output signal is provided across the electrical load by the first and second portions of the output signals.

The amplifier can also include further circuitry for controlling the magnitude of the current conducted by the current supply transistor so that it is independent of variations in the magnitude of a second power supply potential.

BRIEF DESCRIPTION OF THE DRAWINGS

A more complete understanding of the present invention may be derived by reading to the detailed description and claims when considered along with the drawings, in which like reference numbers indicate similar parts, and wherein:

FIG. 1 illustrates a line driver connected to a differential load;

FIG. 2 illustrates a line driver connected to a single ended load; and,

FIG. 3 is a schematic diagram of the amplifier circuitry of one embodiment of the invention.

DETAILED DESCRIPTION OF THE PREFERRED EMBODIMENT

FIG. 1 illustrates line driver amplifier 10 which is connected to drive a differentially connected electrical load. More specifically, amplifier 10 includes input terminal 12, power supply terminal 14 adapted to receive a positive power supply potential ($V_{CC}$) and another power supply terminal 16 adapted to receive a negative power supply potential ($V_{EE}$). Output terminals 18 and 20 of amplifier 10 are, respectively, coupled through balanced transmission line 22 to terminals 24 and 26 of balanced electrial load 28 which might be a line terminator connected in parallel with the input terminals of a receiver in a known manner. Center tap terminal 30 of load 28 is connected to ground or reference potential conductor 32.

Amplifier 10 responds to input waveform 38 which is applied to input terminal 12 by a pre-driver which provides a corresponding waveform 34 at terminal 18. Moreover, amplifier 10 responds to input waveform 38 to provide waveform 36 at terminal 20 which is inverted with respect to waveforms 12 and 34. The output signals across load 28 are "balanced" so long as the magnitude of the signal on terminal 24 swings as much in one direction or polarity as the signal on terminal 26 swings in the other direction or polarity so that the magnitudes of the simultaneous positive and negative excursion are equal or balanced. Under this balanced condition, no wasted current will be conducted through center tap terminal 30 to ground conductor 32.

FIG. 2 shows circuit 10 connected in the single ended mode. More specifically, ground conductor 32 is connected to power supply terminal 16 and through transmission line 22 to output terminal 20 of amplifier 10 and to terminal 26 of load 28, rather than to center tap 30 of electrical load 28 as indicated in FIG. 1. An amplified version 39 of input signal 38 is applied to terminal 24 of load 28 in response to input signal 38.

In some prior circuits, grounding either of terminals of 24 or 26 of load 28 can result in drawing currents of large magnitude through the corresponding output terminal and the active pullup or pulldown devices of the amplifier. This tends to cause excessive heating of such devices which could permanently damage or even destroy sensitive components such as transistors. It is possible that both conductors of transmission line 22 could be accidentally connected to ground thereby creating severe heating of transistors included in such amplifiers. This could cause the amplifier to fail to meet specifications or even render it inoperative.

Changes in temperature or other conditions causes the magnitude of the power supply potential on terminal 14 ($V_{CC}$) and terminal 16 ($V_{EE}$) to undesirably change. Changes in $V_{CC}$ and $V_{EE}$ tend to unequally change the magnitudes of the positive and negative portions of signals 34 or 36 so that they are not equal thereby adversely affecting the symmetry of the output signal across load 28 and undesirably resulting in wasted current being conducted by ground 32. These undesirable results can also be caused by temperature change or other changes within amplifier 10 which varies the operating characteristics of the devices therein.

FIG. 3 illustrates line driver amplifier circuit 40 of one embodiment of the invention which can be used to perform the functions of amplifier 10 in FIGS. 1 and 2. Amplifier 40 as shown in FIG. 3 is connected in a manner similar to amplifier 10 of FIG. 1. Amplifier 40 includes input terminal 42 for receiving input signal 38 and input terminal 44 for receiving either a complementary input signal 45 or a fixed bias potential. Differentially connected NPN bipolar transistors 46 and 48, repectively, include base electrodes 50 and 52 which, respectively, are connected to input terminals 42 and 44. Emitter electrodes 54 and 56 of transistors 46 and 48 are connected together at node 58. Collector electrode 60 of transistor 46 is connected through load resistor 62 to conductor 64 which is adapted to receive the positive power supply potential ($V_{CC}$) applied to terminal 65. Similarly, collector electrode 66 of transistor 48 is connected through load resistor 68 to positive power supply conductor 64. Transistors 46 and 48 can be included in the same integrated circuit structure. Electrical load 28 is coupled by transmission line 22 to amplifier output terminals 69 and 71 which are respectively connected to collector electrodes 60 and 66.

Circuitry for providing a regulated current to node 58 includes terminals 72 and 73 which are adapted to receive negative supply potential ($-V_{EE}$). Resistor 74 couples terminal 72 to non-inverting input terminal 75 of operational amplifier 76 which can be a readily available integrated circuit. Current supply NPN transistor 78 includes a base electrode 80 which is coupled through resistor 82 to output terminal 83 of operational amplifier 76. Current supply transistor 78 further includes collector electrode 84 which is coupled to node 58 and emitter electrode 86 which is coupled to node 88. Resistor 90 couples node 88 to inverting input terminal 92 of operational amplifier 76. Resistor 94 is connected between negative supply terminal 73 and node 88. Resistor 96 is connected between ground potential terminal 97 and node 98. Resistors 90, 94 and 96 provide a feedback network for enabling the regulation of the magnitude of the current of currect supply transistor 78.

Circuitry for correcting or compensating for changes in the magnitude of $V_{CC}$ include resistor 100 which is connected between positive power supply conductor 64 and voltage divider node 102. Resistor 104 is connected between node 102 and ground terminal 103. Resistors 100 and 104 form a voltage divider which provides a selected portion of the voltage between terminals 65 and 103 at node 102. Resistor 106 is connected between node 102 and node 108 which is connected to non-inverting input terminal 75 of operational amplifier 76.

During quiescent operating conditions the network including resistors 100, 104, 106 and 74 provide a bias potential at node 108 which is amplified by operational amplifier 76 to provide a selected potential to the base electrode of current supply transistor 78 which sets the magnitude of the constant current drawn from node 58 by transistor 78. Base electrodes 50 and 52 of respective differential transistors 46 and 48 will be at the same potential during quiescent conditions. Hence, transistors 46 and 48 each conduct equal currents having magnitudes approximately equal to half the magnitude of the constant current sourced or supplied by transistor 78. As a result, load resistors 62 and 68 conduct the equal collector currents of respective transistors 46 and 48 to provide voltages of substantially equal magnitude to terminals 24 and 26 of load 28 so that no current flows through load 28 during quiescent conditions.

During dynamic operating conditions, as input terminal 42 is driven in a positive direction, for instance, relative to input terminal 44 by input signal 38, transistor 46 is rendered more conductive and transistor 48 is rendered less conductive because the magnitude of the current drawn by current supply transistor 78 remains constant. As a result, the voltage on collector 69 of transistor 46 decreases pulling terminal 26 of load 28 in a negative direction while the voltage on collector 66 of transistor 48 rises thereby pushing terminal 24 of load 28 in a positive direction as indicated by the initial portions 110 and 112 of output waveforms 34 and 36.

When the input signal on input terminal 42 swings negative with respect to the signal on input terminal 44, then transistor 46 is rendered less conductive and transistor 48 is rendered more conductive pulling the voltage on terminal 24 in the negative direction and pushing the voltage on terminal 26 in the positive direction as indicated by waveform portions 114 and 116. So long as the potentials on terminals 24 and 26 are pulled equal amounts toward opposite polarities with respect to the potential on ground conductor 32, no wasted current flows through center tap 30 of electrical load 28 into ground 32.

The above description of the operation of circuit 40 has assumed that the potentials on positive supply terminal 14 and the negative supply terminal 16 remain constant. The limit of the negative swing of output signals 34 and 36 at load terminals 24 and 26 is determined by the magnitude of the normally constant current of transistor 78 and the positive limits of the positive excursions is determined by the magnitude of $+V_{CC}$. Circuit 40 is designed so that these limits are equal.

If the magnitude of $-V_{EE}$ undesirably becomes more negative, for instance, current supply transistor 78 tends to draw more current from node 58. This additional current will increase the voltage at node 88 across negative feedback resistor 94. A portion of the voltage across resistor 94 will be applied as a control signal through feedback resistor 90 to inverting input terminal 92 of operational amplifier 76. Consequently, amplifier 76 will invert this positive going signal to provide a more negative signal which reduces the drive to transistor 78 thereby tending stabilize the magnitude of the current drawn by constant current supply transistor 78 with changes in $-V_{EE}$. Similarly, if transistor 78 responds to a change in ambient temperature, for example, to provide less collector-to-emitter current, a voltage of reduced magnitude will be developed across resistor 94 and corresponding control will be fed back through resistor 90 to inverting input terminal 92. Consequently, more base drive will be provided by amplifier 76 to transistor 78 to stabilize the collector-to-emitter current at the selected constant level. Hence, operational amplifier 76, current supply transistor 78 and the resistive feedback network including resistors 90, 94 and 96 operate to compensate for undesired changes in the magnitude of the current through transistor 78 which can be caused either by changes in operating characteristics of transistor 78 or changes in magnitude of negative supply potential, $-V_{EE}$, for example.

Furthermore, an increase, for instance, in the magnitude of positive supply voltage ($V_{CC}$) at terminal 65 tends to undesirably increase the magnitude of the positive excursions or portions 110 and 116 of the output signals which tends to unbalance the output signal if the emitter-to-collector current of transistor 78 has a constant magnitude. However, the voltage across resistors 100 and 104 will increase thereby providing an increased voltage at node 102. Resistor 106 couples a control signal in response to the voltage of increased magnitude at node 102 to non-inverting input terminal 75 of operational amplifier 76. Consequently, the drive to current supply transistor 78 is increased thereby enabling it to provide more emitter-to-collector current for pulling corresponding negative levels 112 and 114 of waveforms 34 and 36 farther in the negative direction so that symmetry is obtained in the positive and negative excursions of output waveforms 34 and 36.

A brief mathematical analysis of circuit 40 follows. Assuming that the resistances of resistor 100 ($R_{100}$) and resistor 104 ($R_{104}$) are small compared to the resistance of resistor 106 ($R_{106}$), application of the well-known superposition theorem provides:

$$V_O = \frac{V_{102} R_{74} - V_{EE} R_{106}}{R_{106} + R_{74}} \left(1 + \frac{R_{90}}{R_{96}}\right) \quad (A)$$

$V_0$ is the voltage at node 88 with respect to ground
$V_{102}$ is the voltage at node 102
$R_{74}$ is the resistance of resistor 74
$R_{94}$ is the resistance of resistor 94
$R_{106}$ is the resistance of resistor 106.
But $$V_0 = V_{94} - V_{VEE} \quad (B)$$

where
$V_{94}$ is the voltage across resistor 94.
Using B to solve A for $V_{94}$.

$$V_{94} = \frac{V_{102} R_{74} - V_{EE} R_{106}}{R_{106} + R_{74}} \left(1 + \frac{R_{90}}{R_{96}}\right) + V_{EE} \quad (C)$$

It is desired that the current through $R_{94}$ and hence the voltage $V_{94}$ be constant with changes in $V_{EE}$ and assuming that $V_{102}$ is constant $$\frac{dV_{94}}{dV_{EE}} = -\frac{R_{106}}{R_{106} + R_{74}} \left(1 + \frac{R_{90}}{R_{96}}\right) + 1 = 0 \quad (D)$$

$$\text{then } \frac{R_{106}}{R_{106} + R_{74}} \left(1 + \frac{R_{90}}{R_{96}}\right) = 1 \quad (E)$$

$$\text{and } \frac{R_{106}}{R_{106} + R_{74}} = \frac{R_{96}}{R_{96} + R_{90}} \quad (F)$$

Meeting the condition of Equation (F) enables circuit 40 to be impervious to change in $V_{EE}$. It was assumed during differentiation that $V_{102}$ was constant. Since $V_{102}$ varies with $V_{CC}$, changes in $V_{CC}$ with change the main current through transistor 78 as has been indicated above.

Thus, amplifier configuration 40 compensates for changes in positive power supply potential $V_{CC}$ by increasing or decreasing the magnitude of the constant current conducted by transistor 78. Changes in the negative supply potential $-V_{EE}$ or other conditions which tend to change the magnitude of the constant emitter-to-collector current of transistor 78 are regulated out by negative feedback. The aforementioned operations also enable amplifier 40 to be powered by a plurality of different power supply voltages.

Transmission line 22 and load 28 have known impedances. The output resistance of amplifier 40 is determined by the resistances of resistors 62 and 68. In a pulsed system it is desirable to minimize reflections on line 22. Load resistors 62 and 68 can be precision discrete components located externally to an integrated or hybrid circuit including transistors 46 and 48. By choosing the values of the resistance of resistors 62 and 68 to each equal half of load resistance 28 and by choosing the load resistance to equal the charactistic resistance of the transmission line, minimum reflection on line 22 can be assured. Thus, the output impedance of circuit 40 is easily changed merely by changing the values of load resistors 62 and 68 so as to match the characteristic impedances of any one of a variety of balanced transmission lines 22 and loads 28.

If amplifier 40 is operated to drive a load in an unbalanced mode, then ground potential 32 will not be applied to center tap 30 of load 28 but will be applied to one or the other of load terminals 24 or 26. Assuming terminal 26 is grounded, for instance, then load resistor 62 will limit the magnitude of the current flowing to ground when transistor 46 is fully non-conductive and transistor 48 is fully conductive. Constant current supply transistor 78 will limit the current through transistor 48 under these conditions. Alternatively, if transistor 46 is rendered fully conductive then the current therethrough is likewise limited by current supply transistor 78 and the current through load 28 to ground is limited by load resistor 68. Hence, transistors 46 and 48 never have to conduct more than the predetermined constant of current determined by the control signals on base 80 of transistor 78. Therefore, the amount of electrical power dissipated by transistors 46 and 48 is limited so that their temperatures never increase beyond a safe level. Thus, amplifier circuit 40 can withstand grounding of either or both of load terminals 24 or 26 while amplifier 40 is powered up without adversely affecting the characteristics of the active devices therein. Hence, amplifier 40 can meet military specifications such as MIL-STD-188-114 and drive either differential or single ended loads.

Thus, it is apparent to one skilled in the art that there has been provided circuitry in accordance with the invention that fully satisfies the objects, aims and advantages set forth above. More specifically, amplifier circuit 40 has been described which will operate in a satisfactory manner even though output terminals 69 and 71 there have been grounded during operation. Also, amplifier circuit 40 also compensates or adjusts for changes in the magnitudes of power supply potentials applied to terminals 65, 72 and 73. Furthermore, amplifier circuit 40 is usable with a variety of different power supply potentials because the drive available for the negative going portions of the output signal or signals is automatically changed as the drive for the positive going portions change in response to variations in $V_{CC}$. Undesired changes induced in amplifier 40 by temperature, $-V_{EE}$ or other conditions are regulated by the feedback network including resistors 90, 94 and 96 and amplifier 76 associated with transistor 78 so as to maintain balance in the magnitudes of the output signals across load 28. The output impedance of amplifier 40 can be readily changed by replacing load resistors 62 and 68 with resistors of different values. Moreover, amplifier 40 has a simple configuration which is inexpensive and readily reproduceable for use in high quantity production.

While the invention has been described in conjunction with a specific embodiment thereof, it is evident that many alterations, modifications and variations will be apparent to those skilled in the art in light of the foregoing description. Accordingly, the invention is intended to embrace all such alterations, modifications and variations in the appended claims.

We claim:

1. An amplifier circuit having an electron control means for providing a constant magnitude signal in response to a drive signal, said electron control means being adapted to receive a first power supply potential which has a varying magnitude that tends to change the drive signal, the amplifier circuit providing an output signal having a magnitude which tends to be adversely effected by variations in the magnitude of the constant magnitude signal, wherein the improvement comprises:

amplifying means having an inverting input terminal and an output terminal, said amplifying means inverting control signals applied to said inverting input terminal thereof and providing these inverted signals at the output terminal thereof, said output terminal being coupled to the electron control means;

feedback means coupled between the electron control means and said inverting input terminal of said amplifying means, said feedback means being further adapted to couple a control signal which varies with the first power supply potential to said inverting input terminal of said amplifying means; and said amplifying means being responsive to said control signals applied thereto through said feedback means to increase the drive to the electron control means in response to variations in the first power supply potential which tend to decrease the drive to the electron control means and to decrease the drive to the electron control means in response to variations in the first power supply potential which tend to increase the drive to the electron control means so that the electron control means provides the constant magnitude signal while being subjected to the variations in the magnitude of the first power supply potential so that the output signal of the amplifier is not adversely effected by the variation of the first power supply potential.

2. The amplifier circuit of claim 1 wherein;

said electron control means includes input, output and control terminals;

said amplifying means includes an operational amplifier; and said feedback means includes first resistive means coupled between said input terminal of the electron control means and said inverting input terminal of said amplifying means and second resistive means adapted to provide the first power supply potential to said first resistive means.

3. The amplifier circuit of claim 1 further including conductive means adapted to apply a second power supply potential having a varying magnitude effecting the magnitude of first portions of the amplifier output signal and thereby tending to unbalance the amplifier output signal, the first portions all having a predetermined polarity, wherein the improvement further comprises:

said amplifying means further including a non-inverting input terminal, circuit means adapted to couple further control signals varying with said variations in said second power supply potential to said non-inverting input terminal of said amplifying means, said amplifying means being responsive to said further control signals to increase the drive to the electron control means in response to increases in the magnitude of said second power supply potential and to decrease the drive to the electron control means in response to decreases in the magnitude of said second power supply potential so that the amplifier circuit provides second portions of the output signal which have a polarity opposite to the predetermined polarity of the first portions, said first and second portions providing a balanced amplifier output signal.

4. The amplifier circuit of claim 3 wherein said circuit means includes voltage divider means.

5. A differential amplifier circuit including first and second differentially connected electron control devices and a current supply device, each of the devices having input, output and control electrodes, the output electrode of the current supply device being connected to the input electrodes of the first and second differentially connected electron control devices, at least one of the control electrodes of the first and second differentially connected electron control devices being adapted to receive an input signal and the first and second differentially connected electron control devices providing an amplified output signal between the output electrodes thereof; the magnitude of the output signal tending to be adversely changed by variations in the magnitude of a first power supply potential coupled to effect the drive to the current supply device, wherein the differential amplifier circuit further includes in combination:

amplifying means having an inverting input terminal and an output terminal, said output terminal being coupled to said control electrode of said current supply device;
  feedback means adapted to receive the first power supply potential, said feedback means being coupled to said inverting input terminal of said amplifying means, said feedback means thereby being adapted to couple control signals varying with the first power supply potential to said inverting input terminal of said amplifying means; and
  said amplifying means being responsive to said control signals applied through said feedback means to increase the drive to the current supply device in response to variations in the first power supply potential which tend to decrease the drive to the current supply device and said amplifying means being responsive to said control signals to decrease the drive to the current supply device in response to variations in the first power supply potential which tend to increase the drive to the current supply device, so that the current supply device provides a current of constant magnitude to said commonly connected input electrodes of said first and second differentially connected electron control devices so that the magnitude of the output signal of the differential amplifier circuit is not adversely changed by the variation in the magnitude of the first power supply potential.

6. The differential amplifier circuit of claim 5 wherein;
  said amplifying means includes an operational amplifier; and
  said feedback means includes first resistive means coupled between said input electrode of the current supply device and said inverting input terminal of said amplifying means and second resistive means adapted to provide the first power supply potential to said first resistive means.

7. The differential amplifier circuit of claim 5 further including conductive means adapted to couple a second power supply potential to the output electrodes of the first and second differentially connected electron control devices, the balance of the output signals of the differential amplifier circuit tending to be adversely effected by variations in the magnitude of the second power supply potential, wherein the improvement further comprises:

said amplifying means having a non-inverting input terminal;
  circuit means adapted to couple further control signals varying with the second power supply potential to said non-inverting input terminal of said amplifying means, said amplifying means being responsive to said further control signals applied through said second circuit means to increase the drive to the current supply device in response to increases in the magnitude of the second power supply potential and to decrease the drive to the current supply device in response to decreases in the magnitude of the second power supply potential so that the amplifier output signals remain balanced.

8. The differential amplifier circuit of claim 7 wherein said circuit means includes voltage divider means.

9. An amplifier circuit for providing balanced output signals across an electrical load, the output signals having first portions of a first polarity which tend to vary in response to the varying magnitude of a first power supply potential, the amplifier circuit including in combination:

first electron control means adapted to receive the first power supply potential, said first electron control means providing the first output signal portions of a first polarity having magnitudes which tend to vary with the variations in the first power supply potential;
  second electron control means providing second output signal portions of a second polarity having magnitudes controlled by the magnitude of a drive signal applied to said second electron control means;
  amplifying means having a non-inverting input terminal and an output terminal, said output terminal of said amplifying means being coupled to said second electron control means;
  circuit means adapted to receive said first power supply potential, said circuit means being coupled to said non-inverting input terminal, said circuit means applying first control signals in response to the variations in the first power supply potential to said non-inverting input terminal of said amplifying means; and
  said amplifying means being responsive to said first control signals to increase the drive to said second electron control means in response to increases in the magnitude of said first power supply potential and to decrease the drive to said second electron control means in response to decreases in the magnitude of the first power supply potential so that said second output signals portions tend to change in response to the variations in magnitudes of the first power supply potential and along with the first portions of the output signal so that a balanced output signal is provided across the electrical load by said first and second portions of the output signal.

10. The amplifier circuit of claim 9 wherein:
said first electron control means further includes differentially connected electron control devices;
said second electron control means includes a constant current supply electron control device coupled to said differentially connected electron control devices;
said amplifying means includes an operatonal amplifier; and
said circuit means includes a voltage divider.

11. The amplifier circuit of claim 9 wherein said second electron control means is adapted to also receive a second power supply potential which has a varying magnitude, the amplifier output signal portions tending to be adversely effected by the variations in the magnitude of the second power supply potential, the amplifier circuit further including in combination:
said amplifying means further having an inverting input terminal, said amplifying means providing inverted output signals at said output terminal thereof in response to control input signals applied to said inverting input terminal thereof;
feedback means being coupled between said second electron control means and said inverting input terminal of said amplifying means, said feedback means being further adapted to provide second control signals in response to the variations in the magnitude of the second variable power supply potential and to couple said second control signals to said non-inverting input terminal of said amplifying means; and
said amplifying means being responsive to said second control signals to increase the drive to said second electron control means in response to the variations in said second power supply potential which tend to decrease the drive to said second electron control means and to decrease the drive to said second electron control means in response to variations in said second power supply potential which tend to increase the drive to said second electron control means so that the magnitude of the current through said second electron control means is rendered insensitive to the variations in the magnitude of the second power supply potential.

* * * * *